United States Patent [19]

Watakabe

[11] Patent Number: 4,678,714
[45] Date of Patent: Jul. 7, 1987

[54] PHOTOMASK MATERIAL

[75] Inventor: Yaichiro Watakabe, Itami, Japan

[73] Assignee: Mitsubishi Denki Kabushiki Kaisha, Tokyo, Japan

[21] Appl. No.: 819,104

[22] Filed: Jan. 15, 1986

[30] Foreign Application Priority Data

Jan. 28, 1985 [JP] Japan .................................. 60-16206

[51] Int. Cl.$^4$ .............................................. B22B 15/00
[52] U.S. Cl. .................................... 428/432; 428/632; 430/5
[58] Field of Search ....................... 428/432, 632, 633; 430/5

[56] References Cited

FOREIGN PATENT DOCUMENTS 56-42176  3/1981  Japan .
56-42183  3/1981  Japan .

Primary Examiner—John E. Kittle
Assistant Examiner—Patrick J. Ryan
Attorney, Agent, or Firm—Lowe Price LeBlanc Becker & Shur

[57] ABSTRACT

A photomask material comprising a transparent glass substrate and a metal silicide film formed on the transparent glass substrate, the rate of a silicon and a metal in the metal silicide film being continuously varied so as to increase the amount of metal toward an upper surface of the metal silicide film.

3 Claims, 4 Drawing Figures

PHOTOMASK MATERIAL

BACKGROUND OF THE INVENTION

1. Field of the Invention

The present invention relates to a photomask material for formation of a photomask used in a manufacturing process of a semiconductor device.

2. Description of the Prior Art

FIGS. 1 and 2 show diagrams for explaining two types of conventional photomask materials which have been used in the manufacture of semiconductor devices. The conventional photomask material shown in FIG. 1 comprises a transparent glass substrate 1, such as silica, and a metal layer or film 2 such as chromium (Cr), tantalum (Ta) and the like which is formed, with about 1000 Å in thickness, by means of evaporation or sputtering. Another conventional photomask material as shown in FIG. 2 comprises a transparent glass substrate 1 and a metal silicide film 3, such as a molybdenum silicide, a titanium silicide and the like which is also formed, with about 1000 Å in thickness, by means of sputtering and the like.

In general, as a hard mask material for a semiconductor device, a chromium film is formed on a transparent glass substrate, with about 1000 Å in thickness, by means of sputtering and the like. This is because such hard mask including a chromium film is useful for fining a patterning as a mask of high integration device and is advantageous as a hard mask having a high reliability, as compared with a conventional emulsion mask.

However, such a chromium film has less adhesive ability to the glass substrate, particularly, to silica glass. For example, after formation of chromium pattern, it is likely that the chromium film is stripped off from the substrate when washed. Metal silicide film using molybdenum, tantalum, titanium and the like serves to increase the joining ability to a transparent glass substrate 1. This is because bond of silicon included in the metal silicide is strongly coupled to a silicon included in the glass substrate containing $SiO_2$ and $Al_2O_3$. In addition, as compared with a chromium film, a metal silicide film is advantageous to a dry etching which is required, together with fining of a pattern, in view of etching speed.

Nevertheless, in case of a photomask material including a metal silicide film 3 formed on a transparent glass substrate 1, an amorphous metal silicide film is formed after formation of the film 3 by means of sputtering and the like, which makes the film quality non-uniform, and hence it is more likely that a very fine defect, such as a generation of pin hole, may be partially caused when washed or the like. Furthermore, flatness of mask is adversely affected by stress in the interface between the transparent glass substrate 1 and the metal silicide film 3.

Incidentally, Japanese Patent Application No. 42176/1981, filed Mar. 23, 1981 and laid open for public inspection Sept. 28, 1982 and Japanese Patent Application No. 42183/1981, filed Mar. 23, 1981 and laid open for public inspection Sept. 28, 1982 disclose that silicon layer and metal layer are deposited on a glass substrate so that a pattern of silicide is formed by an electron beam.

SUMMARY OF THE INVENTION

Accordingly, a principal object of the present invention is to eliminate the above described defects and to provide a photomask material which increases joining ability to a glass substrate and has less stress at the interface between the metal silicide film and the glass substrate.

Briefly stated, the present invention is directed to a photomask material comprising a transparent glass substrate and a metal silicide film formed on the transparent glass substrate, the improvement wherein a rate of deposition of a silicon and a metal included in the metal silicide film is continuously varied so as to increase the amount of metal in relation to silicon towards an upper surface of the film.

According to the present invention, there is provided a photomask material which increases a joining ability between a transparent glass substrate and a metal silicide film and has less stress at an interface and has uniform quality of film.

According to a preferred embodiment of the present invention, the transparent glass substrate is a silica glass. The rate of deposition of a silicon and a metal in the metal silicide film varies linearly.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
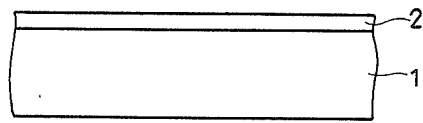
FIG. 1 is a drawing of a conventional photomask material including a metal film.
Figure 2:
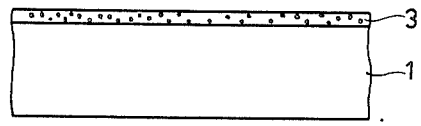
FIG. 2 is a drawing of another conventional photomask material including a metal silicide film.
Figure 3:
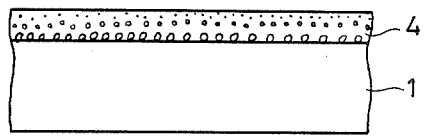
FIG. 3 is a cross sectional view showing a photomask material of one embodiment of the present invention.

Referring to FIG. 3, a metal silicide film 4 is formed on a transparent glass substrate 1 such as a silica, such that more silicon is deposited on the surface of the substrate 1 than a metal, but the amount of the metal increases toward an upper portion of the metal silicide film 4, so that the deposition rate of silicon versus metal is continuously varied. The deposition rate of metal may be 100% in the upper surface of the metal silicide film and the deposition rate of silicon may be 100% in the lower surface, that is, immediately over the substrate surface. Preferably, the deposition rates of silicon and metal is made to be varied in a linear manner.

Figure 4:
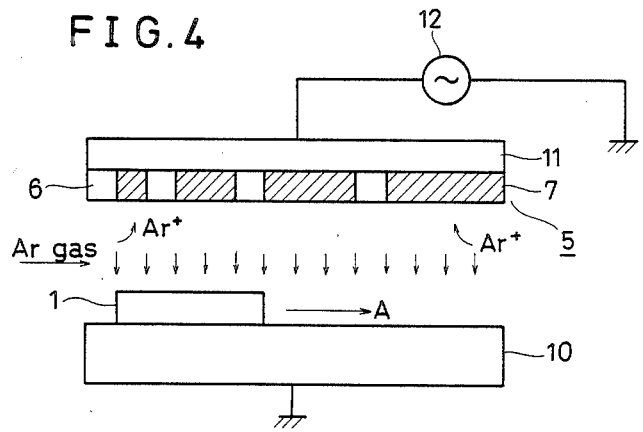
FIG. 4 is a schematic view showing a sputtering apparatus for forming a metal silicide film 4 of the present invention.

FIG. 4 is a schematic diagram of a sputtering apparatus for forming a photomask material shown in FIG. 3, that is, a silicide film 4.

Referring to FIG. 4, a transparent glass substrate 1 is disposed on a cathode electrode 10. A target 5 having a silicon region 6 with a predetermined area and a metal region 7 with a gradually increased area is disposed on an anode electrode 11. The anode electrode 11 is connected to an RF power supply 12, usually having a frequency of 13.56 MHz. On the other hand, the cathode electrode 10 is connected to the ground. The transparent glass substrate 1 on the cathode electrode 10 is adapted to be moved, at a constant speed, toward a direction as indicated by arrow A.

The thickness of the metal silicide film 4 and a deposition rate of silicon and a metal depend on the amount of the silicon 6 and the metal 7 in the target 5 and a moving speed of the transparent glass substrate 1 on the cathode electrode 10.

In order to form the metal silicide film 4 on the transparent glass substrate 1 with a varying deposition rate of silicon 6 and metal 7, the target 5 is structured by the silicon region 6 which has a constant area, and a metal region 7 which has a gradually increased area. A silicon and metal sputtered by argon ion ($Ar^+$) in a vacuum environment is formed on the transparent glass substrate 1. At that time, the deposition rate of silicon and metal can be continuously varied by moving the transparent glass substrate 1 toward a direction as indicated in arrow A, at a constant speed.

Through the above described processes, the metal silicide film 4 is formed on the transparent glass substrate such that the deposition rate of silicon and metal in the metal silicide film is continuously varied so as to increase the amount of the metal toward an upper surface of the film 4. In other words, near the surface of the transparent glass substrate, the metal silicide film 4 contains mostly silicon and near an upper surface of the silicide film 4, the film 4 contains mostly metal. As a result, the silicon dioxide ($SiO_2$) in the transparent glass substrate 1 is strongly coupled to the silicon contained in the metal silicide film 4 so that a strong joining ability between the substrate 1 and the film 4 is obtained. The amount of metal can be controlled such that an optical density capable of testing a size, any defect and the like after formation of mask pattern, which is, for example 3.0, can be obtained. Meanwhile, the optical density is defined as follows. Assuming that optical density is OD, intensity of incident light is $I_0$ and the intensity of light after transmission is I, the optical density is represented as follows:

$$OD = \log (I_o/I)$$

For example, when $I_0$ is equal to 1000I, $$OD = \log (1000I/I) = \log 10^3 = 3.0$$

As described in the foregoing, since a metal silicide film is formed on a transparent glass substrate such that an excessive silicon is contained near a surface of the transparent glass substrate and a metal is gradually increased toward an upper surface of the metal silicide film so that the deposition rate of silicon and metal contained in the metal silicide film is continuously varied, there is obtained an advantage that a photomask material has a good joining ability between a transparent glass substrate and a metal silicide film and hence has a high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. a photomask material comprising a transparent glass substrate and a metal silicide film formed on said transparent glass substrate, the metal silicide film having a lower surface contacting the substrate and an upper surface opposed to the lower surface, the improvement wherein
    the rate of deposition of silicon in relation to metal contained in said metal silicide film is continuously varied so as to increase the amount of metal toward the upper surface of the metal silicide film.
2. A photomask material in accordance with claim 1, wherein
    said transparent glass substrate is a silica glass.
3. A photomask material in accordance with claim 1, wherein
    said deposition rate of silicon in relation to metal contained in the metal silicide film is varied in a linear manner.

* * * * *